United States Patent
Cai et al.

(10) Patent No.: US 10,749,031 B2
(45) Date of Patent: Aug. 18, 2020

(54) LARGE AREA CONTACTS FOR SMALL TRANSISTORS

(71) Applicants: INTERNATIONAL BUSINESS MACHINES CORPORATION, Armonk, NY (US); GLOBALFOUNDRIES, Inc., Grand Cayman (KY); STMICROELECTRONICS, INC., Coppell, TX (US)

(72) Inventors: Xiuyu Cai, Niskayuna, NY (US); Qing Liu, Watervliet, NY (US); Ruilong Xie, Schenectady, NY (US); Chun-Chen Yeh, Clifton Park, NY (US)

(73) Assignees: INTERNATIONAL BUSINESS MACHINES CORPORATION, Armonk, NY (US); STMICROELECTRONICS, INC., Coppell, TX (US); GLOBALFOUNDRIES, INC (KY)

( * ) Notice: Subject to any disclaimer, the term of this patent is extended or adjusted under 35 U.S.C. 154(b) by 110 days.

(21) Appl. No.: 15/273,778

(22) Filed: Sep. 23, 2016

(65) Prior Publication Data
US 2017/0012130 A1    Jan. 12, 2017

Related U.S. Application Data

(63) Continuation of application No. 14/584,639, filed on Dec. 29, 2014, now Pat. No. 9,466,722.

(51) Int. Cl.
*H01L 29/78* (2006.01)
*H01L 29/417* (2006.01)
(Continued)

(52) U.S. Cl.
CPC .... *H01L 29/7851* (2013.01); *H01L 21/02181* (2013.01); *H01L 21/28518* (2013.01);
(Continued)

(58) Field of Classification Search
CPC ........... H01L 29/7851; H01L 21/28518; H01L 21/76897; H01L 29/66545;
(Continued)

(56) References Cited

U.S. PATENT DOCUMENTS 8,946,828 B2   2/2015  Sun et al.
9,012,999 B2   4/2015  Liu et al.
(Continued)

OTHER PUBLICATIONS

List of IBM Patents or Patent Applictions Treated as Related; (Appendix P), Date filed Sep. 23, 2016 2 pages.
(Continued)

*Primary Examiner* — Yu-Hsi D Sun
(74) *Attorney, Agent, or Firm* — Cantor Colburn LLP; Steven Meyers

(57) ABSTRACT

A large area electrical contact for use in integrated circuits features a non-planar, sloped bottom profile. The sloped bottom profile provides a larger electrical contact area, thus reducing the contact resistance, while maintaining a small contact footprint. The sloped bottom profile can be formed by recessing an underlying layer, wherein the bottom profile can be crafted to have a V-shape, U-shape, crescent shape, or other profile shape that includes at least a substantially sloped portion in the vertical direction. In one embodiment, the underlying layer is an epitaxial fin of a FinFET. A method of fabricating the low-resistance electrical contact employs a thin etch stop liner for use as a hard mask. The etch stop liner, e.g., $HfO_2$, prevents erosion of an adjacent gate structure during the formation of the contact.

10 Claims, 7 Drawing Sheets

(51) Int. Cl.
  *H01L 29/66*      (2006.01)
  *H01L 29/08*      (2006.01)
  *H01L 29/45*      (2006.01)
  *H01L 21/02*      (2006.01)
  *H01L 21/8234*    (2006.01)
  *H01L 21/768*     (2006.01)
  *H01L 21/285*     (2006.01)

(52) U.S. Cl.
  CPC .............. *H01L 21/76897* (2013.01); *H01L 21/823425* (2013.01); *H01L 21/823431* (2013.01); *H01L 21/823437* (2013.01); *H01L 29/0847* (2013.01); *H01L 29/41783* (2013.01); *H01L 29/41791* (2013.01); *H01L 29/45* (2013.01); *H01L 29/665* (2013.01); *H01L 29/6656* (2013.01); *H01L 29/66545* (2013.01); *H01L 29/66795* (2013.01); *H01L 29/785* (2013.01)

(58) Field of Classification Search
  CPC ........ H01L 21/823425; H01L 29/6656; H01L 29/45; H01L 29/0847; H01L 29/665; H01L 21/02181; H01L 21/823431; H01L 21/823437; H01L 29/66795
  See application file for complete search history.

(56) References Cited

U.S. PATENT DOCUMENTS

| | | | |
|---|---|---|---|
| 9,331,159 B1 | 5/2016 | Jha et al. | |
| 2004/0262650 A1 | 12/2004 | Iwata et al. | |
| 2013/0065371 A1* | 3/2013 | Wei | H01L 21/76224 438/294 |
| 2014/0001561 A1 | 1/2014 | Cheng et al. | |
| 2014/0054715 A1* | 2/2014 | Liu | H01L 21/82342 257/369 |
| 2014/0264348 A1* | 9/2014 | Tsai | C30B 25/165 257/57 |
| 2014/0361352 A1* | 12/2014 | Hung | H01L 21/28008 257/288 |
| 2014/0363984 A1* | 12/2014 | Fukuda | H01L 21/0274 438/778 |

OTHER PUBLICATIONS

U.S. Appl. No. 14/584,639, filed Dec. 29, 2014; Entitled: Large Area Contacts for Small Transistors.

* cited by examiner

LARGE AREA CONTACTS FOR SMALL TRANSISTORS

DOMESTIC PRIORITY

This application is a continuation of the legally related U.S. application Ser. No. 14/584,639 filed Dec. 29, 2014, which is fully incorporated herein by reference.

BACKGROUND

The present disclosure generally relates to scaling of integrated circuits and, in particular, to lowering contact resistance associated with integrated circuit transistors having device dimensions below 20 nm.

As integrated circuit transistors become smaller, making electrical contact to the transistor terminals becomes more and more challenging. As the contact area shrinks, the associated contact resistance increases according to the relationship $R=\rho\, l/A$, wherein A is the contact surface area at the point of contact through which current flows, l is the height of the contact in the direction of current flow, and $\rho$ is the resistivity of the contact metal. Increases in contact resistance significantly degrade overall device performance. Thus, it is important to address and compensate for the increased contact resistance that occurs with each new technology generation by making changes in the transistor design, the contact design, or the transistor fabrication process.

Another problem that occurs when forming contacts to transistor source and drain regions is that formation of the contact openings tends to erode underlying dielectric materials at a fast rate. Such dielectric materials may include sidewall spacers or a cap that protects the gate structure during formation of contacts to the source and drain. In the past, such dielectric materials covering the gate electrode were simply made thicker to compensate for the erosion. However, smaller transistor dimensions now prevent further thickening the dielectric material covering the gate electrode.

BRIEF SUMMARY

A self-aligned, tapered electrical contact for use in integrated circuits features a bottom profile that is substantially sloped or includes at least a substantially sloped portion. The sloped bottom profile provides a larger electrical contact area A, thus reducing the contact resistance R, while maintaining a small contact footprint. The sloped bottom profile can be formed by recessing an underlying layer, wherein the bottom profile can be crafted to have a V-shape, U-shape, crescent shape, or other profile shape that includes at least a substantially sloped portion in the vertical direction. In one embodiment, the underlying layer in which the sloped bottom profile of the contact is created can be an epitaxial fin of a FinFET.

A method of fabricating the self-aligned tapered electrical contact employs a thin hard mask for use as an etch stop liner during contact formation. The thin hard mask prevents erosion of an adjacent gate structure during the contact etch process. In particular, a dielectric cap on top of the gate electrode and sidewall spacers on either side of the gate electrode are protected by the thin hard mask while the sloped bottom profile of the contact is formed. In one embodiment, the thin hard mask is made of halfnium oxide ($HfO_2$).

BRIEF DESCRIPTION OF THE DRAWINGS

In the drawings, identical reference numbers identify similar elements or acts. The sizes and relative positions of elements in the drawings are not necessarily drawn to scale.

DETAILED DESCRIPTION

Figure 1:
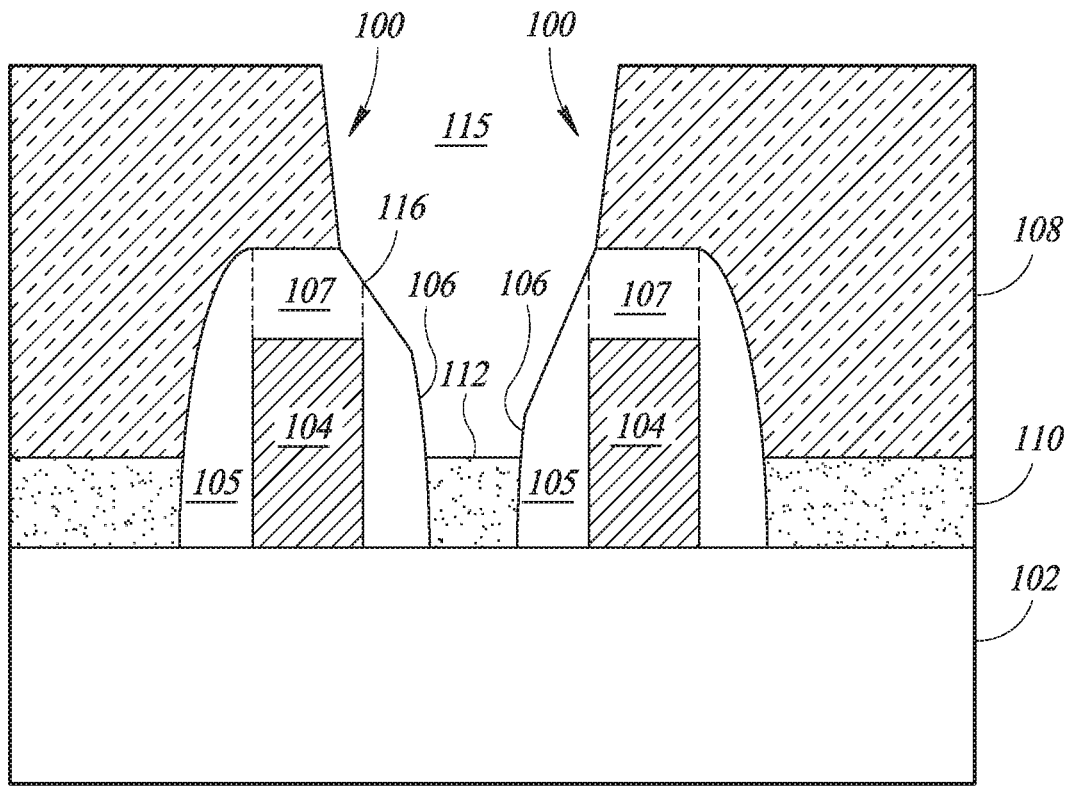
FIG. 1 is a cross-sectional view of a pair of transistors in which a contact opening has compromised a dielectric cap covering the gate, according to 25 the prior art.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to transistors and device interconnect structures that have been produced; however, the present disclosure and the reference to certain materials, dimensions, and the details and ordering of processing steps are exemplary and should not be limited to those shown.

Turning now to the figures, FIG. 1 shows a pair of conventional transistor gate structures 100 formed on a silicon substrate 102. Two such gate structures are shown. The transistor gate structures 100 may be parts of a FinFET transistor array, or an FD-SOI type transistor array, for example. Each gate structure 100 includes a metal gate 104 and, adjacent to the metal gate 104, is a dielectric layer 106 made of silicon nitride (SiN). The dielectric layer 106 includes sidewall spacer portions 105 that protect sidewall surfaces of the metal gate 104, and a dielectric cap portion 107 that protects a top surface of the metal gate 104.

A thick insulator 108, e.g., silicon dioxide ($SiO_2$), covers the gate structures 100. Raised source and drain regions located on either side of each gate structure 100 are formed in an epitaxial layer 110 made of, for example, silicon (Si) or silicon germanium (SiGe). The source/drain region 112 located between two adjacent transistors includes a source region for one transistor and a drain region for the other transistor. The metal gate 104 is configured to control current flow within the channel region, between the source and the drain.

The epitaxial layer 110 may form a fin of a FinFET, wherein a portion of the fin serves as the channel region of the FinFET. The source and drain regions in the epitaxial layer of the FinFET may extend above the substrate to form a raised source/drain.

It is desired to make electrical contact with the epitaxial layer 110 located in the source/drain region 112 between the two gate structures. Hence, a contact opening 115 is formed by etching away the thick insulator 108 down to the source/drain region 112. When the etch selectivity to SiN is poor, the etching step tends to erode the dielectric layer 106, causing dielectric damage 116. Erosion of the dielectric layer 106 occurs at a corner of the gate, thus affecting both the sidewall spacer portions 105 and the dielectric cap portion 107. Increasing the thickness of the dielectric layer 106 is not a preferred solution for avoiding the dielectric damage 116, due to consequences for later processing steps.

Figure 2A:
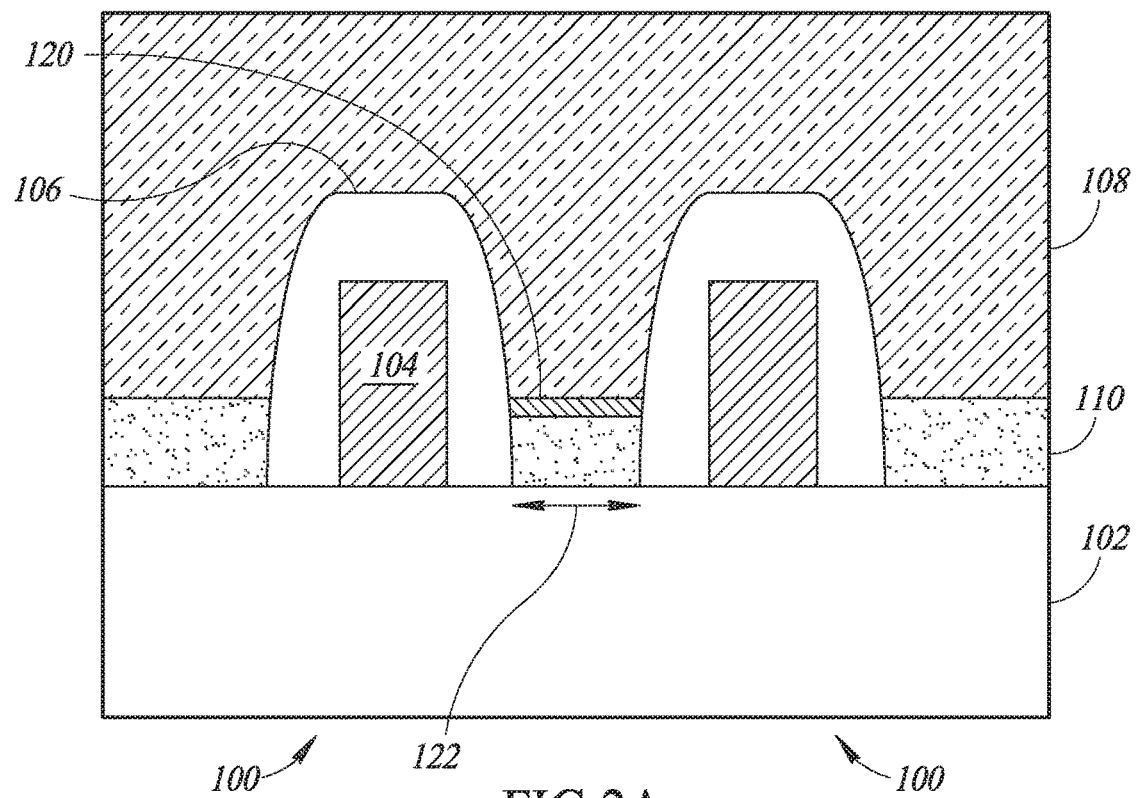
FIG. 2A is a cross-sectional view of a pair of transistors showing a large contact landing area between two conventional transistor gates, according to the prior art.
Figure 2B:
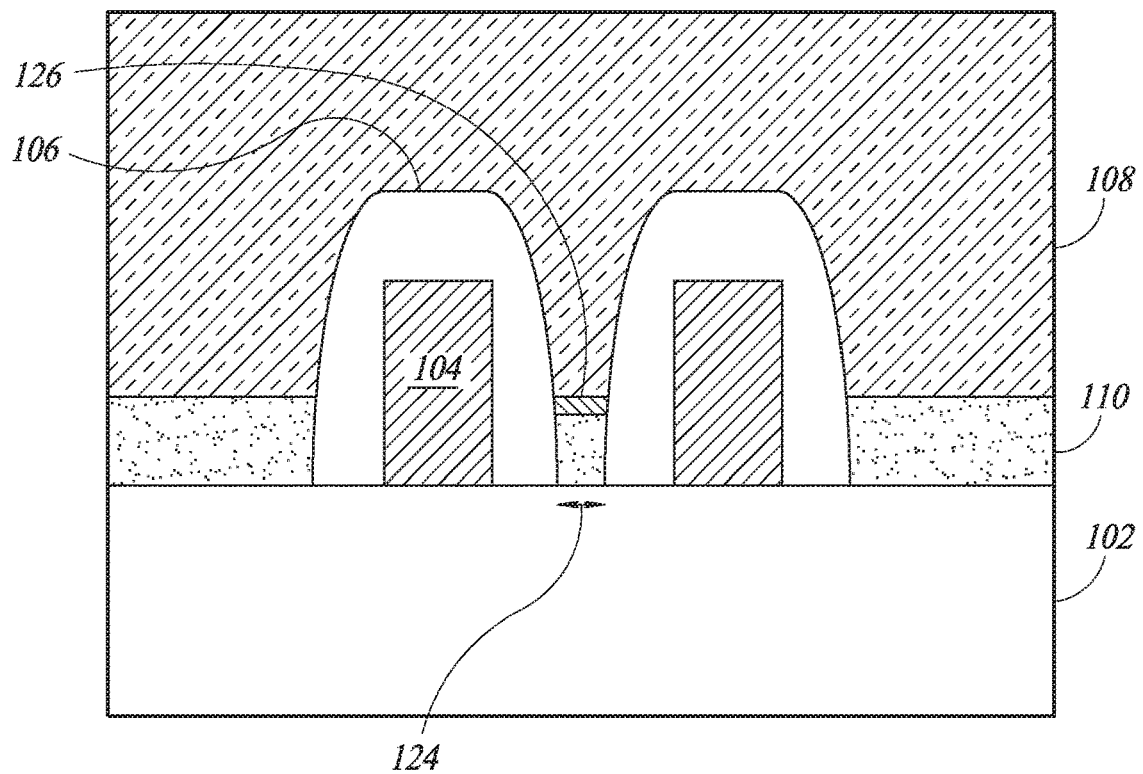
FIG. 2B is a cross-sectional view of a pair of transistors showing the effect on contact landing area of scaling transistor size and spacing to meet target dimensions less than 20 nm, according to one exemplary embodiment described herein.

FIGS. 2A and 2B show a comparison of two transistor geometries—a large source/drain region having a wide spacing 122 between adjacent gate structures 100 shown in FIG. 2A, and a scaled down source/drain region having a narrow spacing 124 between adjacent gate structures 100 shown in FIG. 2B.

The top surface of the epitaxial layer 110 will later support a wide silicide layer 120, and a narrow silicide layer 126, respectively, to serve as landing areas for source/drain contacts. The spacings 122, 124 define widths of the respective silicide layers 120, 126, which will later determine the contact resistance to the source and drain terminals located between the two gate structures 100. The contact resistance R generally increases linearly with a decrease in the silicide area A.

Figure 3:
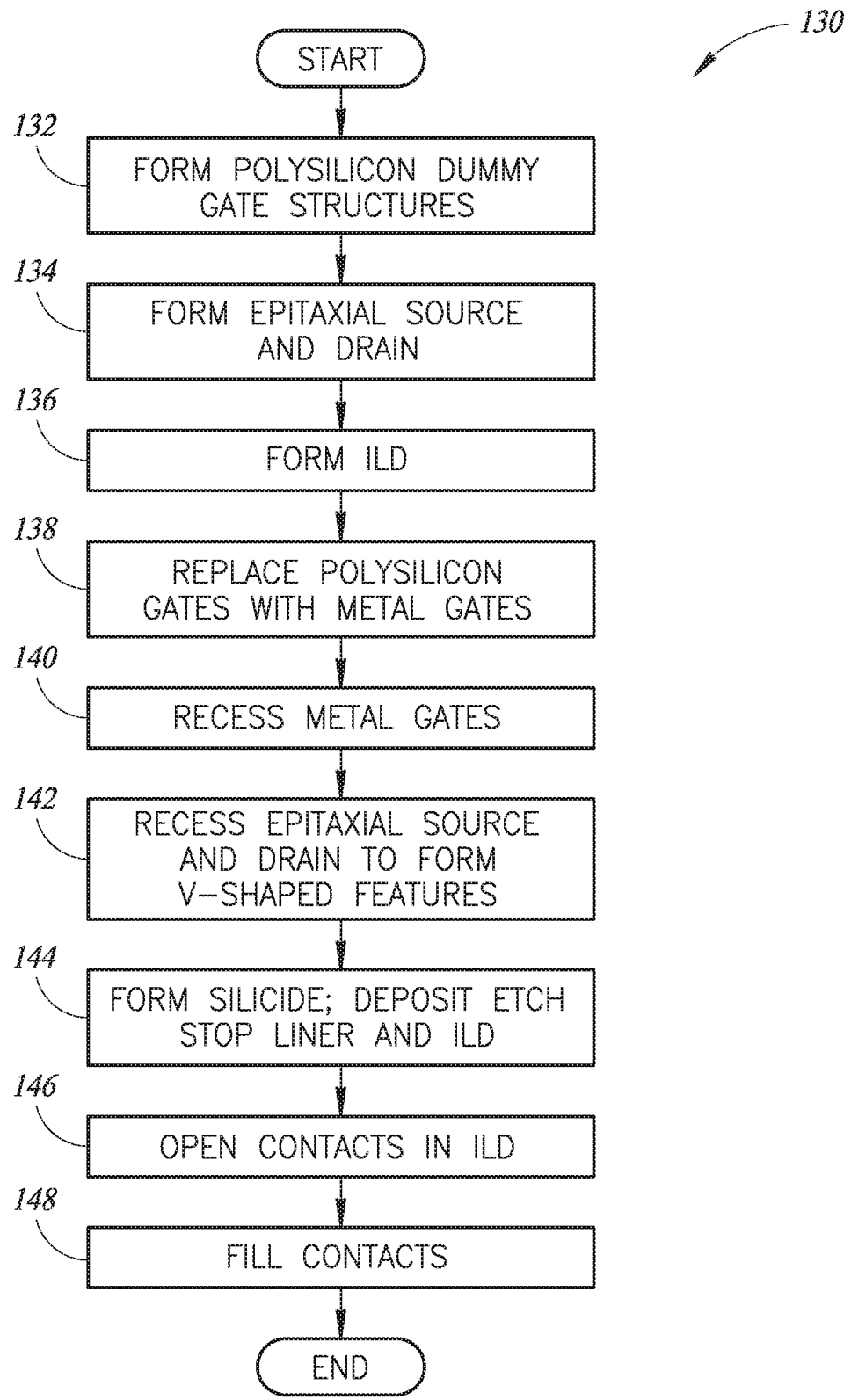
FIG. 3 is a flow diagram showing a sequence of processing steps in an exemplary method of fabricating transistors having contacts with sloped bottom profiles, according to one exemplary embodiment described herein.

FIG. 3 shows a sequence of steps in an inventive method 130 of fabricating large area contacts to the scaled down source/drain region 118, according to one embodiment. Steps in the method 130 are detailed below with reference to FIGS. 4A, 4B, 5A, 5B, 6A, 6B, and 7. It is noted that elements of the inventive structures shown in FIGS. 4A-7 that may be similar to corresponding elements of conventional structures shown in the above prior art drawings share the same reference numerals.

Figure 4A:
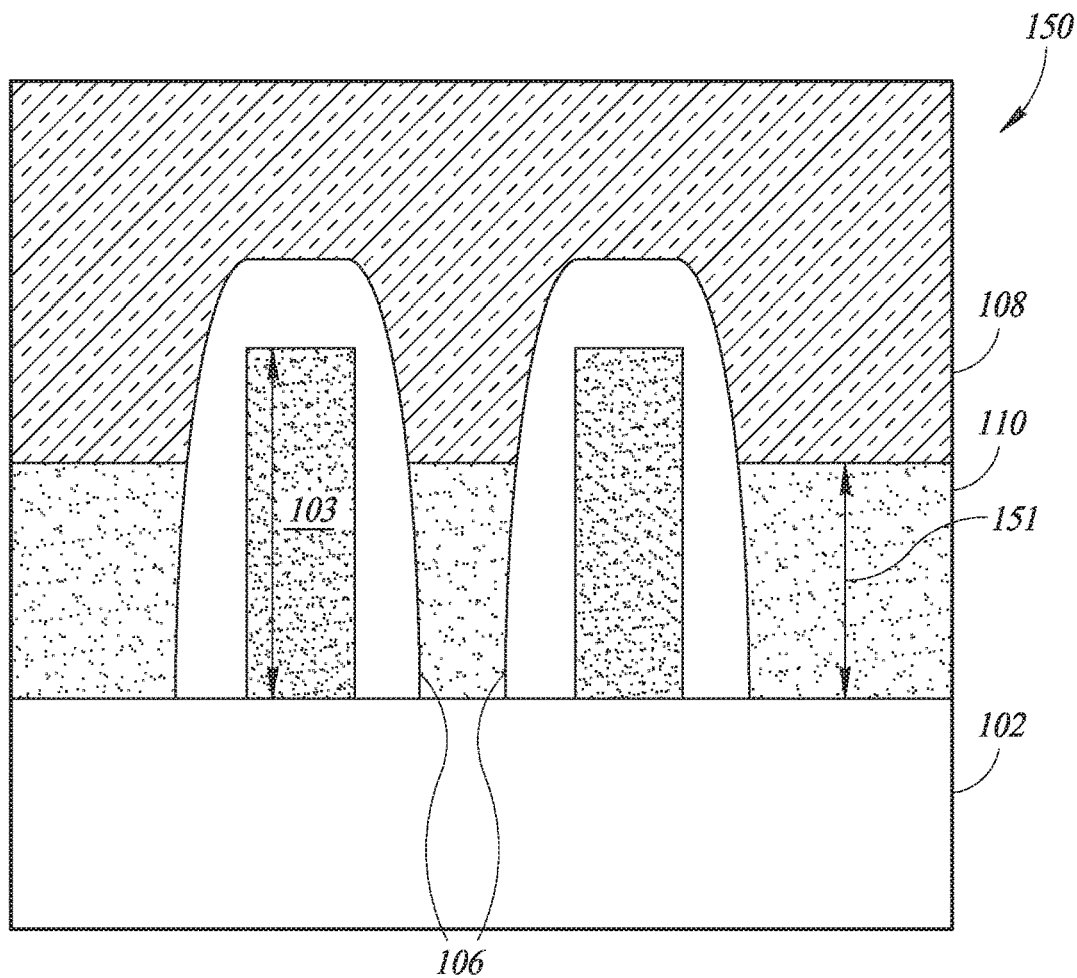
FIGS. 4A, 4B, 5A, 5B, 6A and 6B are cross-sectional views illustrating exemplary transistor fabrication process steps shown in FIG. 3 and described herein.

FIG. 4A shows polysilicon dummy gate structures 150 and an epitaxial layer 110 formed on the substrate 102, according to one embodiment. In one embodiment, the epitaxial layer 110 is an epitaxial silicon fin of a FinFET.

At 132, dummy gate structures 150 are formed on the substrate 102 according to conventional methods well known in the art of semiconductor device fabrication. The substrate 102 can be made of silicon, or the substrate 102 can be a silicon-on-insulator (SOI) substrate that includes a buried oxide layer. Each dummy gate structure includes a temporary polysilicon gate 103, dielectric layer 106 e.g., a conformal silicon nitride (SiN) spacer, and a thick interlayer dielectric (ILD) layer. The polysilicon gate 103 is initially formed as an amorphous silicon gate, and then annealed to form a polycrystalline structure. The conformal silicon nitride spacer, as deposited, covers the top and the sides of the polysilicon gate 103. The dummy gate structures 150 serve as sacrificial layers that provide a temporary structure during formation of other parts of the FinFETs.

At 134, a thick epitaxial layer 110 is grown from the silicon substrate, between and outside the gate structures 150. The epitaxial layer 110 desirably has a height 151 in the range of about 40-65 nm. The epitaxial layer 110 will form source and drain regions and the fin that serves as the channel of the FinFET.

At 136, a thick insulator 108 is formed by depositing a 50-100 nm thick ILD layer such as silicon dioxide ($SiO_2$) on top of the epitaxial layer 110.

Figure 4B:
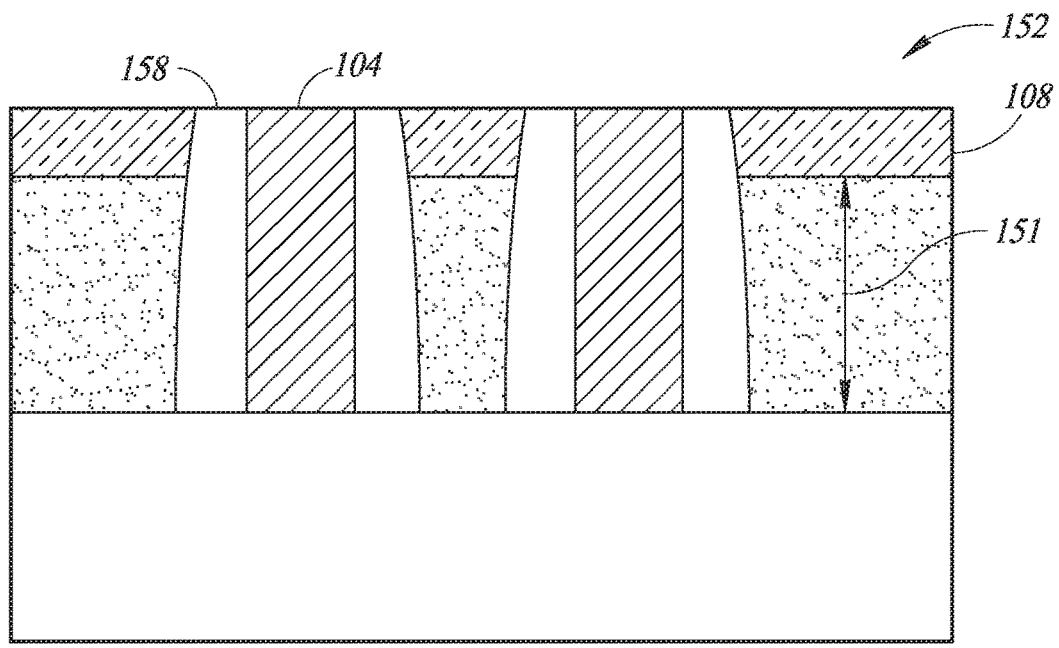

FIG. 4B shows metal gate structures 152 formed on the substrate 102, according to one embodiment. The metal gate structures 152 serve as gate electrodes configured to control current flow within a channel region of the device.

At 138, the dummy polysilicon gates 103 are replaced with metal gates 104. First, top portions of the thick insulator 108 and the dielectric layer 106 are removed by chemical-mechanical planarization (CMP). Removal continues down to a top surface of the polysilicon gate 103, which serves as a polish stop layer, approximately 90 nm above the surface of the substrate 102. The CMP process thus exposes the polysilicon gates 103 and creates sidewall spacers 158. Next, the polysilicon gates 103 are removed, for example, using a reactive ion etch (RIE) process followed by a wet chemical etch process that consumes silicon with high selectivity to SiN and $SiO_2$. Then, a high-k insulating material is conformally deposited to form a thin gate oxide, e.g., $HfO_2$, followed by deposition of a metal gate that can include, for example, titanium nitride (TiN), titanium carbide (TiC), and tungsten (W). After deposition of the metal gate materials, a tungsten polish step planarizes the metal gates 104 using the sidewall spacers 158 as a CMP stop layer.

Figure 5A:
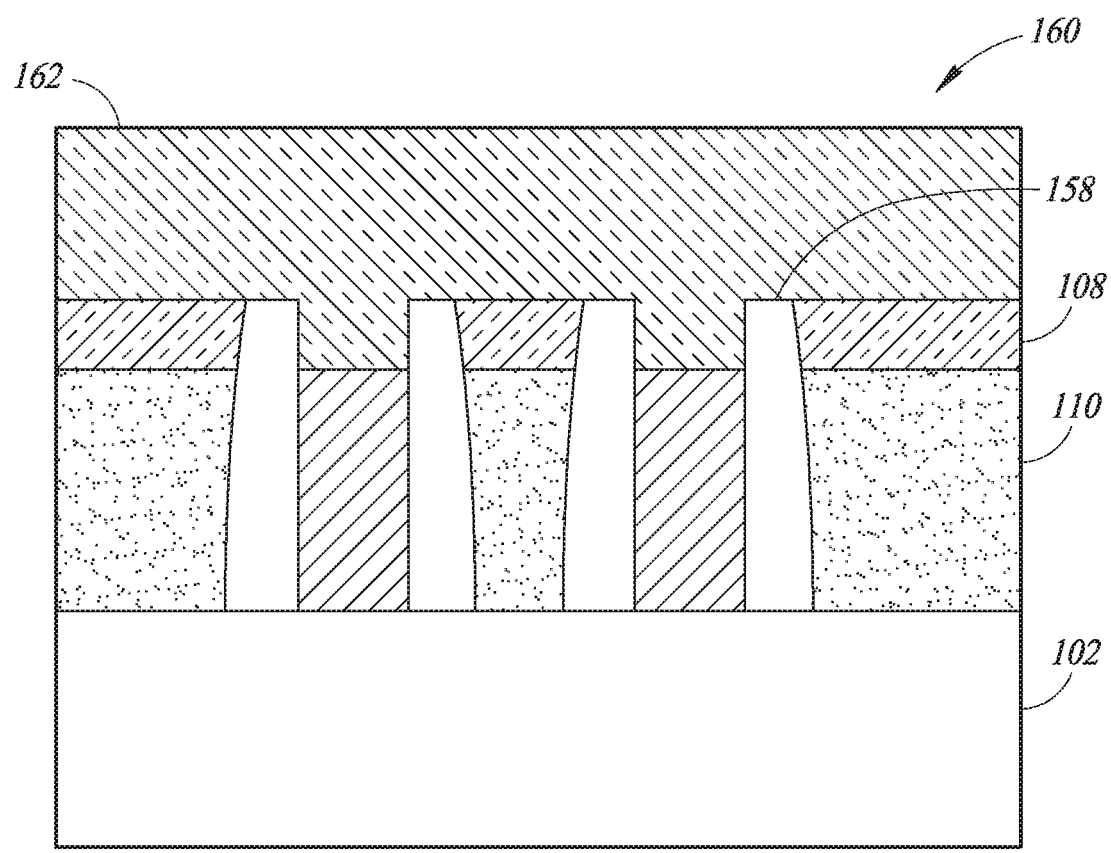
Figure 5B:
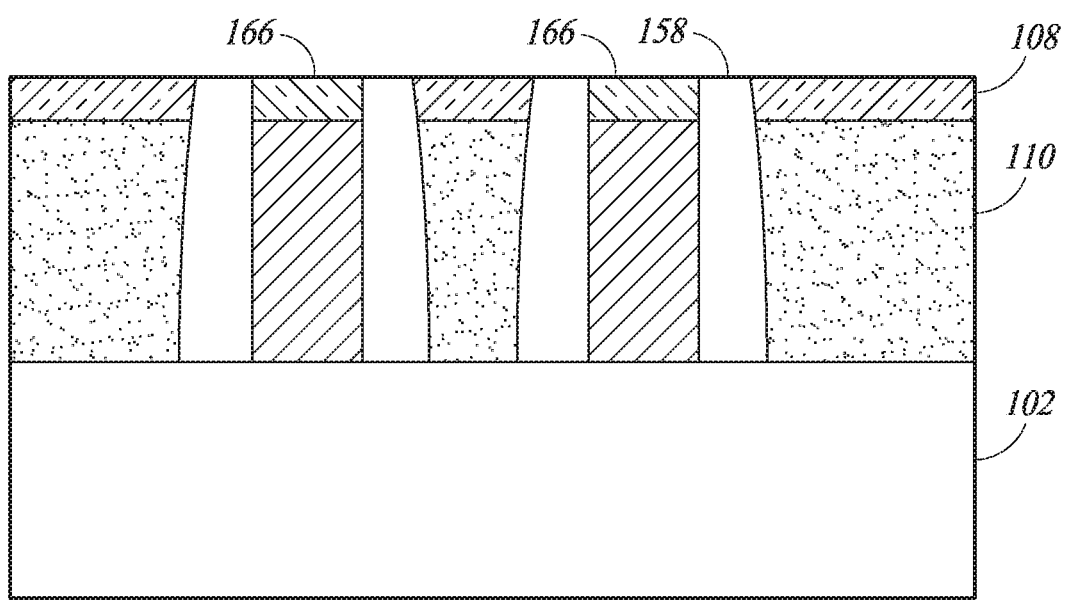

FIGS. 5A-5B show formation of recessed metal gate structures 160 having a dielectric cap 166, according to one embodiment.

At 140, the metal gates 104 are recessed using a shallow tungsten recess etch process that consumes about 20-30 nm of W with high selectivity to SiN and $SiO_2$.

Following the gate recess step, the dielectric cap layer 162 is formed on top of the recessed metal gate structures 160. The dielectric cap layer 162 can be made of an oxide, nitride, or similar insulating material. The dielectric cap layer is then planarized using the sidewall spacers 158 as a CMP stop layer, leaving dielectric caps 166 in the recessed areas over the metal gates 104.

Figure 6A:
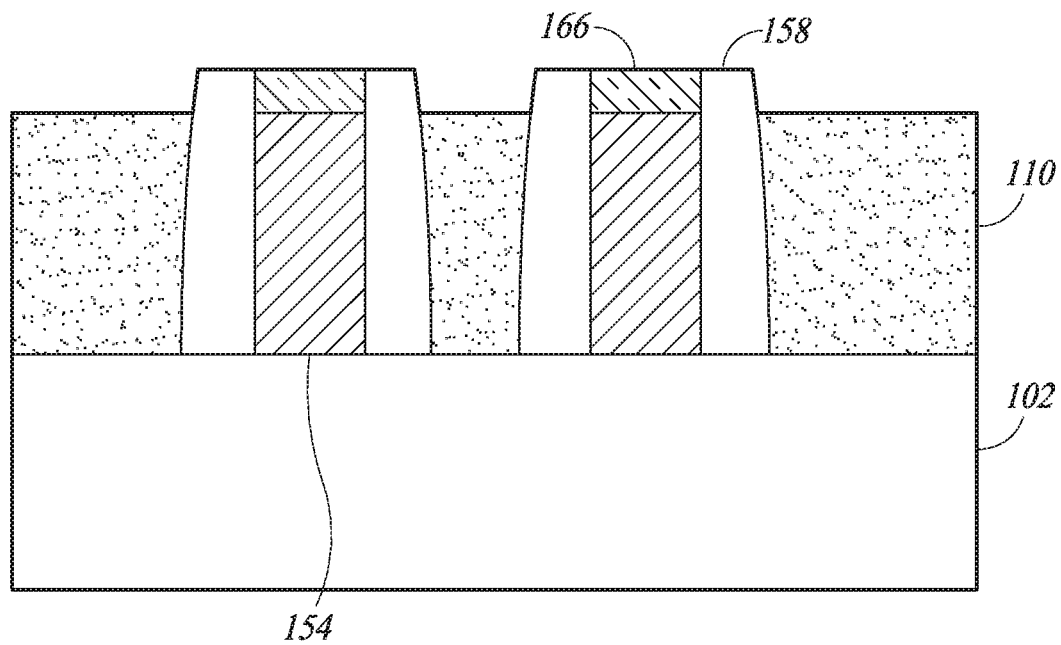
Figure 6B:
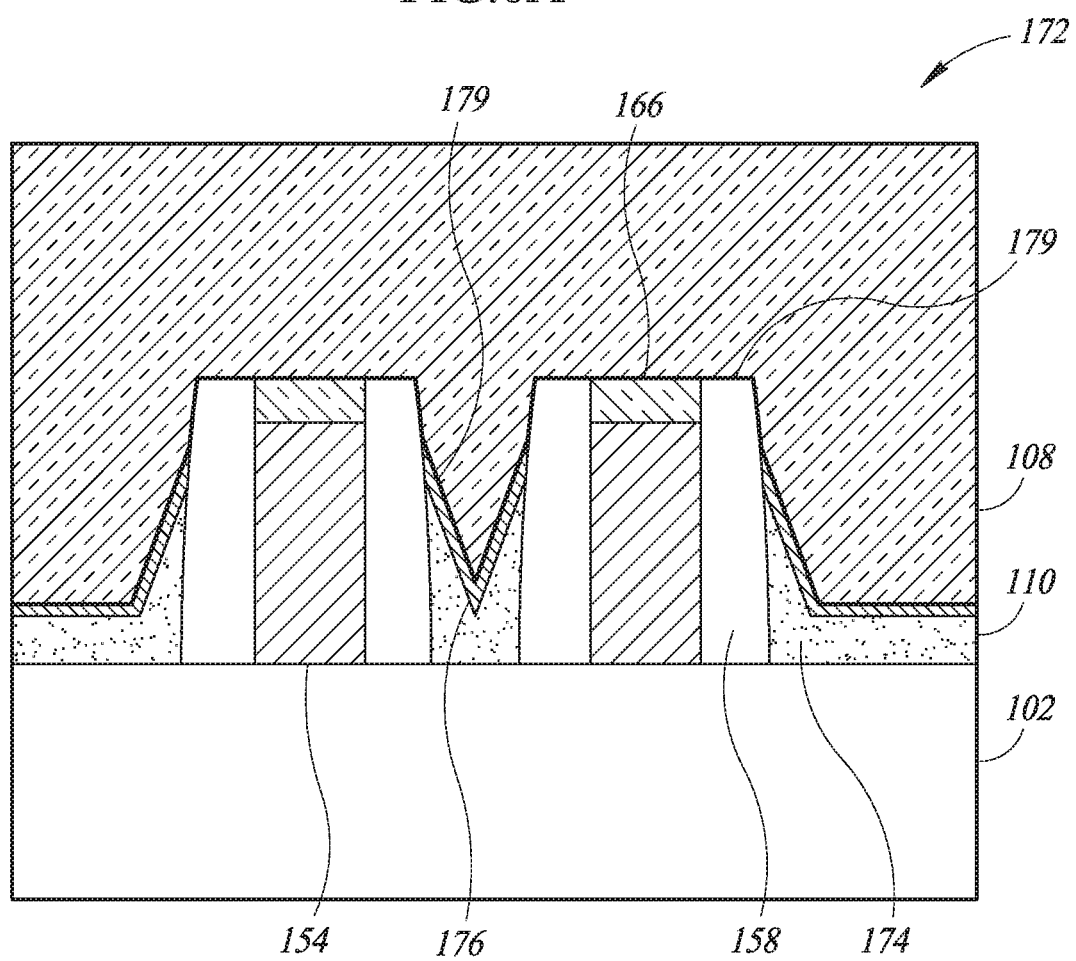

FIGS. 6A-6B show formation of V-shaped recessed source and drain regions in the epitaxial layer 100, according to one embodiment.

At 142, the epitaxial layer 110 is recessed to form V-shaped surface features 172 so as to increase the surface area of the epitaxial layer 110. First, the source and drain regions are exposed by removing the remainder of the thick insulator 108 using an oxide deglaze process. The oxide de-glaze process can be, for example, a hydrofluoric acid (HF) dip. The V-shaped surface features 172 will provide the desired sloped bottom profiles for contacts to the source and drain regions. The V-shaped epitaxial recess profile can be achieved using a silicon reactive ion etch (RIE) process, e.g., an $HBr/O_2$-based plasma etch that is tuned to have a high selectivity to SiN and $SiO_2$ to prevent erosion of the sidewall spacers 158 and the dielectric caps 166. The etch process chemistry and parameters, e.g., gas pressure, power, and the like, that are used to recess the epitaxial layer 110 can be designed to remove silicon preferentially in a diagonal direction aligned with a certain crystal plane, e.g., the (111) crystal plane, as opposed to the (100) crystal plane which is aligned along the vertical direction. In this way, it is possible to create steeply-sloped sidewalls that form V-shaped or crescent-shaped surface features. The depth of the V-shaped surface features 172 is about 25-30 nm. For wider openings, the same etch process may result in a U-shaped profile instead of a V-shaped profile.

At 144, a thin metal layer is conformally deposited on top of the metal gate structures and the recessed epitaxial layer 110. As the thin metal layer reacts chemically with the silicon epitaxial layer 110, a blanket silicide 176 is formed, having a thickness in the range of about 5-10 nm. The metal component of the blanket silicide 176 can be any suitable interconnect metal known in the art, e.g., titanium, tungsten, nickel, platinum, and the like. The blanket silicide 176 follows the V-shaped surface features 172. Next, a thin hard mask for use as an etch stop liner 179 is formed on the surface of the silicide 176 and the metal gate structures. The thin etch stop liner 179 can be, for example, a layer of hafnium oxide ($HfO_2$) having a thickness in the range of about 1-10 nm, with a thickness target of about 3 nm. Finally, the insulator 108, a thick oxide, is restored on top of the metal gate structures and the V-shaped surface features 172. The insulator 108 then is planarized to a final thickness of at least 100 nm.

Figure 7:
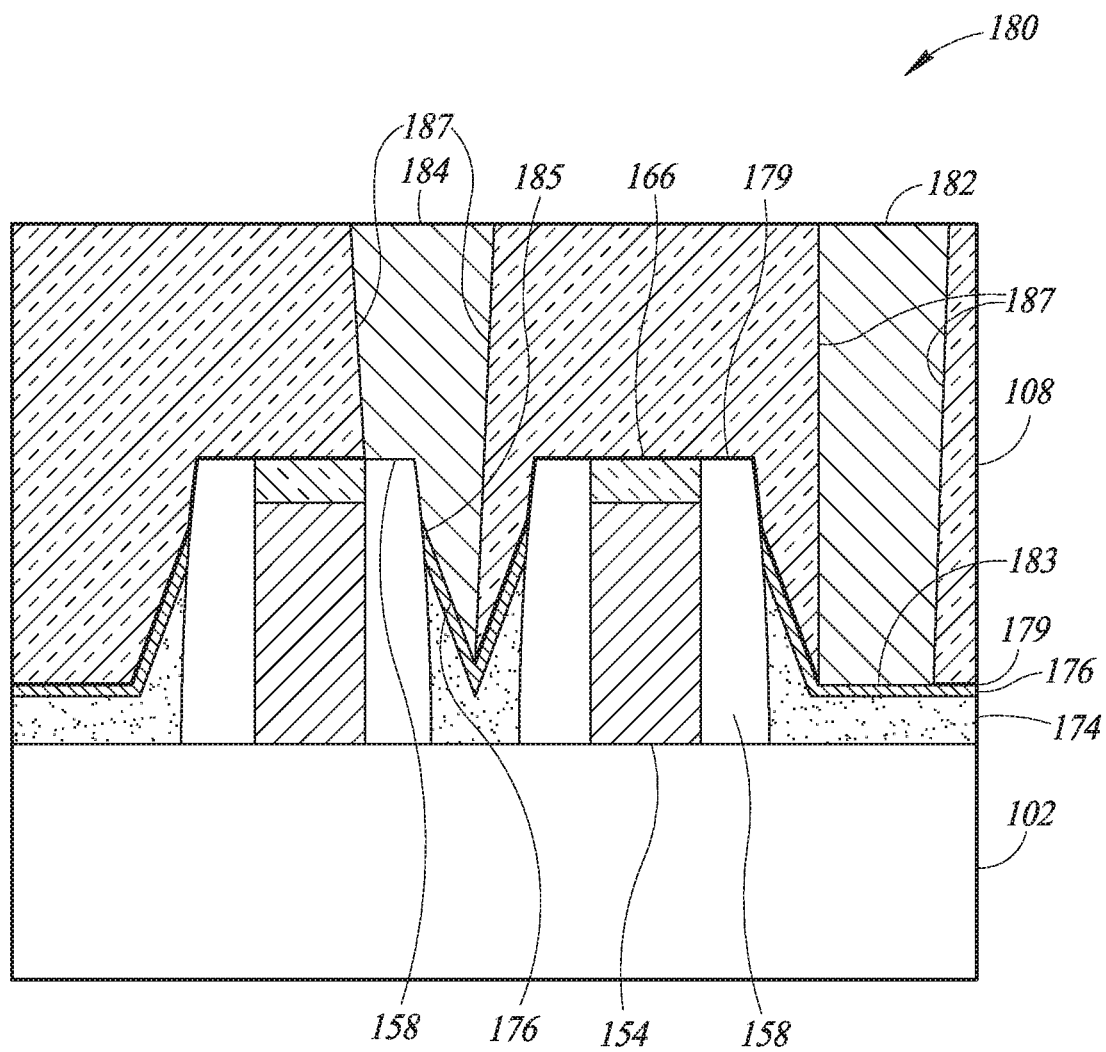
FIG. 7 is a cross-sectional view of a completed pair of transistors having large area, low resistance source/drain contacts according to one exemplary embodiment described herein.

FIG. 7 shows a completed transistor structure 180 having fully formed large surface area contacts 182, 184 to the source and drain regions, according to one embodiment. The large surface area contacts 182, 184 are vertical columns containing a conducting material, e.g., metal, having a planar top surface, a bottom surface that can have either a planar bottom profile 183 or a sloped bottom profile 185, and sidewalls 187 that taper from the top surface to the bottom surface. The finished contacts shown in FIG. 7 are formed as follows:

At 146, the thick insulator 108 is patterned with self-aligned contacts to form tapered source/drain contact openings. The thick oxide can be etched using a chlorine-based RIE process that is selective to the etch stop liner 179. The etch stop liner 179 remains on the corners of the sidewall spacers 158 as a protective layer. The etch stop liner 179 also remains on the dielectric cap 166 as an additional mask that prevents erosion of the dielectric cap 166 during the contact etch step. As a final step of the contact etch process, the etch stop liner 179 is removed from the silicide 178 at the bottoms of the contact openings using a wet chemical dip.

At 148, the contact openings are filled with metal to form the large surface area contacts 182, 184. The contact metal can be any suitable metal that is typically used in interconnects such as for example, tungsten, copper, silver, aluminum, titanium, titanium nitride, platinum, and the like, and combinations thereof. In one embodiment, the contact is lined with TiN and then filled with tungsten (W).

Contacts 182 that land on relatively open areas of the epitaxial layer 174 can have planar bottom profiles 183. However, a contact 184 that lands close to a gate or between adjacent transistor gates desirably has a bottom profile 185 that includes one or more substantially sloped portions at the metal-silicide interface. The sloped portions can be V-shaped as shown. Alternatively, the sloped portions can be U-shaped, crescent-shaped, convex-shaped (conforming to a concave-shaped source/drain region), or they can have any other suitable profile, e.g., wavy, sawtooth, or the like that provides an increased contact area. When a contact 184 lands partially on silicide 176 and partially on a sidewall spacer 158, referred to as an unlanded contact, electrical current in the unlanded contact flows around the interface with the insulating sidewall spacer 158 toward the silicide 176 for conduction to the epitaxial layer 174. Thus, when unlanded contacts are used, because the contact area at the spacer interface does not provide an electrical path, it is even more advantageous to have a sloped bottom profile 185 having a contact area proportional to a sloped profile length, rather than a flat bottom profile 183, for which the contact resistance is much greater.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transistor structure, comprising:
   a gate structure overlying a channel region, the gate structure comprising a metal gate, a sidewall spacer, and a gate cap positioned directly on the metal gate;
   a raised source/drain region positioned on a topmost surface of a substrate, the raised source/drain region made of a doped semiconductor material, the raised source/drain region having a concave-shaped upper source/drain contact surface, at least part of the upper source/drain contact surface being located adjacent the gate structure and above at least part of the channel region;
   an electrical contact comprising a bottom contact surface, the bottom contact surface comprising a first portion substantially conforming to the concave-shaped upper source/drain contact surface and a second portion substantially conforming to a top surface of the sidewall spacer, wherein the first portion comprises a bottommost surface of the electrical contact and the bottommost surface is not parallel to the topmost surface of the substrate; and
   an etch stop liner in direct contact with the gate cap, the etch stop liner overlying portions of the raised source/drain region that are not underneath the electrical contact.

2. The transistor structure of claim 1 wherein the electrical contact includes tapered sidewalls connecting a top contact surface to the bottom contact surface.

3. The transistor structure of claim 1 wherein the electrical contact has a lower contact portion including components of both a metal material and the semiconductor material.

4. The transistor structure of claim 1 wherein the etch stop liner has a thickness in the range of about 1-10 nm.

5. The transistor structure of claim 1 wherein the electrical contact lands partially on the source/drain region and partially on a sidewall spacer of the gate structure.

6. The transistor structure of claim 1 wherein the transistor is a FinFET having a fin, and a portion of the fin serves as the channel region.

7. The transistor structure of claim 1 wherein the gate structure comprises a dielectric cap covering a top surface of a gate electrode and sidewall spacers covering sidewalls of the gate electrode.

8. The transistor structure of claim 7 wherein the dielectric cap has a substantially uniform thickness of at least 20 nm.

9. The transistor structure of claim 7 wherein the sidewall spacers have a substantially uniform thickness of at least 20 nm.

10. The transistor structure of claim 1 wherein the transistor is a FinFET having a fin, and the source/drain region extends out from a top surface of the fin.

\* \* \* \* \*